United States Patent
Shin et al.

(10) Patent No.: US 11,360,377 B2
(45) Date of Patent: Jun. 14, 2022

(54) HALF-TONE ATTENUATED PHASE SHIFT BLANKMASK AND PHOTOMASK FOR EUV LITHOGRAPHY

(71) Applicant: S&S TECH Co., Ltd., Daegu-si (KR)

(72) Inventors: Cheol Shin, Daegu-si (KR); Jong-Hwa Lee, Daegu-si (KR); See-Jun Jeong, Daegu-si (KR); Chul-Kyu Yang, Daegu-si (KR)

(73) Assignee: S&S TECH Co., Ltd., Daegu-si (KR)

( * ) Notice: Subject to any disclaimer, the term of this patent is extended or adjusted under 35 U.S.C. 154(b) by 64 days.

(21) Appl. No.: 17/079,120

(22) Filed: Oct. 23, 2020

(65) Prior Publication Data

US 2021/0124254 A1    Apr. 29, 2021

(30) Foreign Application Priority Data

Oct. 23, 2019  (KR) .......................... 10-2019-0132314
Dec. 2, 2019   (KR) .......................... 10-2019-0158325

(51) Int. Cl.
  *G03F 1/24*   (2012.01)
  *G03F 1/32*   (2012.01)

(52) U.S. Cl.
  CPC . *G03F 1/24* (2013.01); *G03F 1/32* (2013.01)

(58) Field of Classification Search
  CPC ..................................... G03F 1/24; G03F 1/32
  USPC ............................................................. 430/5
  See application file for complete search history.

(56) References Cited

U.S. PATENT DOCUMENTS 8,962,220 B2 *   2/2015   Matsuo ..................... G03F 1/24
                                                                                430/5

* cited by examiner

*Primary Examiner* — Christopher G Young
(74) *Attorney, Agent, or Firm* — William Park & Associates Ltd.

(57) ABSTRACT

The disclosure relates to a half-toned attenuated shift blankmask for extreme ultraviolet lithography including: a reflective film, a capping film, a first etch stop film, a phase shift film, a second etch stop film, and an absorbing film that are sequentially provided on a transparent substrate. The phase shift film has a high reflectance of 20% or more, so characteristics of NILS and MEEF are improved during wafer printing.

13 Claims, 1 Drawing Sheet

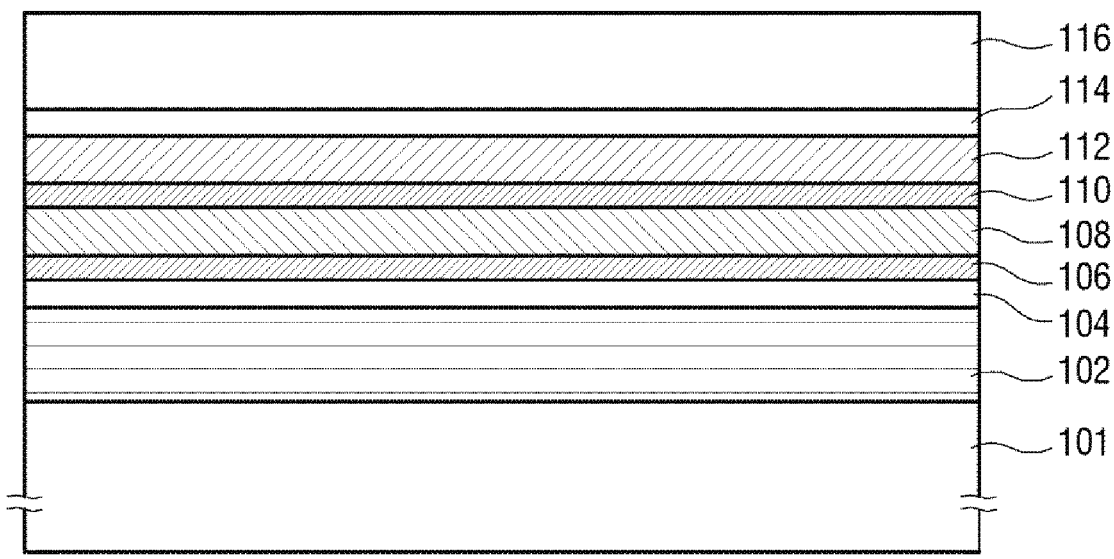

HALF-TONE ATTENUATED PHASE SHIFT BLANKMASK AND PHOTOMASK FOR EUV LITHOGRAPHY

CROSS-REFERENCE TO RELATED APPLICATIONS

This application claims priority from Korean Patent Application Nos. 10-2019-0132314 filed on Oct. 23, 2019 and 10-2019-0158325 filed on Dec. 2, 2019 in the Korean Intellectual Property Office, the disclosure of which is incorporated herein by reference.

TECHNICAL FIELD

The disclosure relates to a phase shift blankmask and photomask for extreme ultraviolet (EUV) lithography, and more specifically, to a half-tone attenuated phase shift blankmask and photomask for EUV lithography having a high reflectance of 20% or more with respect to an exposure wavelength in order to improve characteristics of a normalized image log slope (NILS) and a mask error enhancement factor (MEEF) during wafer printing.

BACKGROUND ART

Recently, lithography technology for manufacturing semiconductor is evolving from ArF, ArFi, and multiple (MP) lithography technologies to EUV lithography technology. The EUV lithography technology is technology that is in the limelight for manufacturing semiconductor devices of 10 nm or less because the EUV lithography enables resolution and process simplification by using an exposure wavelength of 13.5 nm.

On the other hand, the EUV lithography technology may not use the existing refractive optical system such as photolithography using KrF or ArF light because EUV light is well absorbed by all materials, and a refractive index of a material at the wavelength is close to 1. For this reason, in the EUV lithography, a photomask using a reflective optical system is used.

A blankmask is a raw material of the photomask, and is structured to include two thin films on a substrate to form a reflective structure: a reflective film reflecting EUV light and an absorbing film absorbing EUV light. In addition, the blankmask may include a capping film that protects the reflective film, a backside conductive film for e-chucking, and the like. More specifically, the blankmask for EUV is structured to include a reflective film made of Mo/Si on a $SiO_2$—$TiO_2$-based low thermal expansion material (LTEM) substrate having a low coefficient of thermal expansion, a ruthenium (Ru)-based capping film on the reflective film, and a tantalum (Ta)-based absorbing film on the capping film. The photomask formed in this way has a form in which the absorbing film is patterned, and uses a principle of forming a pattern on a wafer by using a difference in contrast between a reflectance of the reflective film and a reflectance of the absorbing film.

On the other hand, in recent years, there is a need to develop a blankmask for EUV for manufacturing devices of 10 nm or less, in particular, 7 nm or 5 nm or less, and 3 nm or less in the future. Accordingly, there is a need to develop a blankmask having an excellent normalized image log slope (NILS) and mask error enhancement factor (MEEF) due to characteristics of the Blankmask for EUV. The existing binary masks for extreme ultraviolet lithography have poor imaging performance because it is difficult to secure the NILS of 2.0 or more when a logic or a DRAM device having a pattern of 32 nm or less pitch is exposed.

DISCLOSURE

Technical Problem

Accordingly, an object of the disclosure is to provide a half-toned attenuated shift blankmask and photomask for EUV lithography with excellent characteristics of a normalized image log slope (NILS) and mask error enhancement factor (MEEF).

Another object of the disclosure is to provide a half-tone attenuated phase shift blankmask and photomask for EUV lithography having a high reflectance of 20% or more and preferably 20% to 60% in a dark area (area where an absorbing film is present).

Technical Solution

According to an aspect of the disclosure, a half-toned attenuated shift blankmask for extreme ultraviolet lithography includes a reflective film, a capping film, a first etch stop film, a phase shift film, a second etch stop film, and an absorbing film that are sequentially provided on a transparent substrate.

The blankmask may further include a hardmask film provided on the absorbing film.

The first etch stop film may be made of silicon (Si) alone or a compound in which at least one of oxygen (O), nitrogen (N), carbon (C), hydrogen (H), boron (B), and metal is contained in the silicon (Si).

The first etch stop film may have a thickness of 1 nm to 5 nm.

The phase shift film may have a reflectance of 20% or more with respect to an extreme ultraviolet exposure wavelength.

The phase shift film may be made of ruthenium (Ru) alone, a compound in which at least one of oxygen (O), nitrogen (N), carbon (C), hydrogen (H), and boron (B) is contained in the ruthenium (Ru), or a compound in which at least one of oxygen (O), nitrogen (N), carbon (C), hydrogen (H), and boron (B) is contained in the ruthenium (Ru) and molybdenum (Mo).

The phase shift film may have a thickness of 10 nm to 50 nm.

The second etch stop film may be made of chromium (Cr), or a chromium (Cr) compound in which at least one of oxygen (O), nitrogen (N), carbon (C), hydrogen (H), and boron (B) is contained in the chromium (Cr).

The second etch stop film may have a thickness of 1 nm to 10 nm.

The absorbing film may be made of tantalum (Ta) or a tantalum (Ta) compound in which at least one of oxygen (O), nitrogen (N), carbon (C), hydrogen (H), and boron (B) is contained in the tantalum (Ta).

The absorbing film may have a thickness of 10 nm to 50 nm.

The hardmask film may be made of chromium (Cr) or a chromium (Cr) compound in which at least one selected from oxygen (O), nitrogen (N), carbon (C), hydrogen (H), and boron (B) is contained in the chromium (Cr).

According to another aspect of the disclosure, a photomask manufactured using the half-toned attenuated shift blankmask for extreme ultraviolet lithography having the above structure is provided.

Advantageous Effects

According to the disclosure, the blankmask includes the phase shift film having a high reflectance of 20% or more, and preferably 20 to 60%. Accordingly, the characteristics of the NILS and MEEF are improved during the wafer printing.

DESCRIPTION OF DRAWINGS

FIG. 1 is a cross-sectional view illustrating a half-toned attenuated shift blankmask for extreme ultraviolet lithography according to the disclosure.

MODE FOR DISCLOSURE

FIG. 1 is a cross-sectional view illustrating a half-toned attenuated shift blankmask for extreme ultraviolet lithography according to an embodiment of the disclosure.

The half-toned attenuated shift blankmask for extreme ultraviolet lithography according to the disclosure has a structure in which a reflective film 102 in which 40 to 60 layers of Mo/Si are stacked, a capping film 104 containing Ru, a first etch stop film 106, a phase shift film 108, a second etch stop film 110, an absorbing film 112, a hardmask film 114, and a resist film 116 are sequentially stacked on an LTEM transparent substrate 101.

The first etch stop film 106 has an etch selectivity of 10 or more with respect to the capping film 104 containing Ru that is disposed thereunder. The first etch stop film 106 may be made of silicon (Si) alone or a compound in which at least one of oxygen (O), nitrogen (N), carbon (C), hydrogen (H), boron (B), and metal is contained in the silicon (Si), and is preferably made of a silicon (Si) compound at least containing silicon (Si) and nitrogen (N). The first etch stop film 106 is etched with a chlorine (Cl)-based etching gas, and when oxygen (O) is contained, since Ru is etched together, it is preferable that the first etch stop film 106 does not contain oxygen (O). The first etch stop film 106 has a thickness of 1 nm to 5 nm, and preferably 2 nm to 4 nm. When the first etch stop film 106 has a thickness of 5 nm or more, a reflectance of a phase shift pattern in which a final pattern is formed decreases, and when the first etch stop film 106 has a thickness of 1 nm or less, it is difficult for the first etch stop film 106 to perform the role as an etch stop film.

The phase shift film 108 is made of a material having high transmittance and easy phase shift control with respect to an extreme ultraviolet exposure wavelength. To this end, the phase shift film 108 contains ruthenium (Ru) alone or a compound in which at least one of oxygen (O), nitrogen (N), carbon (C), hydrogen (H), and boron (B) is contained in ruthenium (Ru), and in particular, preferably contains nitrogen (N) and oxygen (O).

In addition, the phase shift film 108 contains at least one selected from tantalum (Ta), titanium (Ti), cobalt (Co), indium (In), niobium (Nb), molybdenum (Mo), nickel (Ni), and chromium (Co) that are contained in ruthenium (Ru) to reduce a shadowing effect due to the thickness, and may be made of a compound in which at least one of oxygen (O), nitrogen (N), carbon (C), hydrogen (H), and boron (B) is additionally contained in the materials. In particular, the phase shift film 108 contains molybdenum (Mo) among the materials, and is preferably made of a compound containing at least one of oxygen (O), nitrogen (N), carbon (C), hydrogen (H), and boron (B).

The phase shift film 108 may be formed in a single layer or a multilayered structure of two or more layers, and may be formed in either a single layer or a continuous layer.

The phase shift film 108 has a phase shift amount of 120 to 240° with respect to the extreme ultraviolet exposure wavelength, and preferably has a phase shift amount of 190 to 240°.

After the pattern is formed, the phase shift film 108 has a reflectance of 20% or more with respect to the exposure wavelength, and preferably has a reflectance within 20 to 60%.

The phase shift film 108 has a thickness of 10 nm to 50 nm, and preferably 20 nm to 40 nm.

The phase shift film 108 is etched with a fluorine (F)-based etching gas.

The second etch stop film 110 is provided on the phase shift film 108 and has an etch selectivity of 10 or more with respect to the absorbing film 112 formed containing tantalum (Ta).

The second etch stop film 110 may be made of a material etched with the chlorine (Cl)-based gas, and in particular, may be made of chromium (Cr) or a chromium (Cr) compound in which at least one of oxygen (O), nitrogen (N), carbon (C), hydrogen (H), and boron (B) is contained in the chromium (Cr). The second etch stop film 110 is preferably formed by including oxygen (O) in the chromium (Cr). The second etch stop film 110 has a thickness of 1 nm to 10 nm, preferably 5 nm or less, and more preferably 4 nm or less.

The absorbing film 112 may be made of tantalum (Ta) or a tantalum (Ta) compound in which at least one of oxygen (O), nitrogen (N), carbon (C), hydrogen (H), and boron (B) is contained in the tantalum (Ta), and in particular, is preferably made of one of TaN, TaBN, TaON, and TaBON. The absorbing film 112 has a thickness of 10 nm to 50 nm, and preferably 10 nm to 40 nm.

The hardmask film 114 may be made of chromium (Cr) or a chromium (Cr) compound in which at least one of oxygen (O), nitrogen (N), carbon (C), hydrogen (H), and boron (B) is contained in the chromium (Ca), and in particular, is preferably made of a compound in which oxygen (O) is contained in at least the chromium (Cr).

The hardmask film 114 has a thickness of 1 nm to 10 nm, and preferably 2 nm to 5 nm.

The resist film 116 has a thickness of 40 nm to 150 nm.

The blankmask according to the disclosure having the above structure is provided with a phase shift film having a high reflectance of 20% or more and preferably 20 to 60%, so it is possible to secure the characteristics and process margin of the NILS, the mask error enhancement factor (MEEF), and the like during the wafer printing.

Example

Manufacturing of high transmittance phase shift blankmask for EUV

To manufacture the blankmask, the low thermal expansion material (LTEM) substrate 101 that has a size of 6 inch×6 inch×0.25 inch, has total indicated reading (TIR) controlled to be 30 nm or less, and is made of $SiO_2$—$TiO_2$ component was prepared.

Next, although not illustrated in FIG. 1, a conductive film containing chromium (Cr) as a main component was formed on a rear surface of the LTEM substrate 101 using a DC magnetron reactive sputtering facility. The conductive film has a three-layer structure, in which each layer is made of CrCON, CrN, and CrCON. Specifically, the conductive film used a chromium (Cr) target, and a first layer adjacent to a rear surface of a substrate, which is made of CrCON, was formed at a thickness of 30 nm by injecting a gas of $Ar:N_2:CO_2$=7 sccm:7 sccm:7 sccm and using a process power of 1.0 kW. Thereafter, a second layer of a CrN thin film having a thickness of 20 nm was formed by injecting a gas of Ar:N$_2$=5 sccm:5 sccm onto the CrCON thin film of the first layer and using a process power of 1.0 kW. Subsequently, a third layer of CrCON thin film having a thickness of 10 nm was formed by injecting a gas of Ar:N$_2$:CO$_2$=7 sccm:7 sccm:7 sccm onto the CrN thin film of the second layer again and using a process power of 1.4 kW. As a result, the formation of the conductive film was completed. At this time, as a result of measuring a sheet resistance of the conductive film using a 4-point probe, it was confirmed that there was no problem in E-chucking with an electrostatic chuck by indicating a sheet resistance value of 55Ω/□, and it was indicated that the roughness measured in the area of 1 μm×1 μm using AFM equipment is 0.4 nm RMS.

Thereafter, the molybdenum (Mo) layer and the silicon (Si) layer each were alternately formed on a front surface of the LTEM substrate 101 to have a thickness of 4.8 nm and a thickness of 2.2 nm by using ion beam deposition-low defect density (hereinafter, referred to as 'IBD-LDD') equipment, and as a result, the reflective film 102 in which 40 layers of Mo/Si are stacked was formed. As a result of measuring the reflectance of the reflective film 102 using an EUV reflectometer, it was indicated that the reflectance is 67.8% at a wavelength of 13.5 nm. As a result of measuring a surface roughness of the reflective film 102 using atomic force microscopy (AFM) equipment, it was indicated that the surface roughness is 0.12 nm RMS, and when EUV exposure light is reflected from the reflective film 102, it could be confirmed that less diffuse reflection due to the surface roughness occurs. In addition, as a result of measuring the total indicated reading of the reflective film 102 having an area of 142 mm$^2$ using the ultra-flat device, it was indicated that a TIR value is 54 nm, and when it is considered that the TIR value of the LTEM substrate 101 is 45 nm, it could be confirmed that there is little distortion of the pattern position due to the reflective film.

The capping film 104 was formed by stacking the ruthenium (Ru) layer on the reflective film 102 to a thickness of 2.5 nm using the IBD-LDD equipment. As a result of measuring the reflectance in the same manner as in the reflective film 102 after the formation of the capping film 104, the reflectance was 65.8% at a wavelength of 13.5 nm, so it was confirmed that there is little change in the reflectance compared to 67.8% that is the reflectance value of the reflective film 102. In addition, as a result of measuring the surface roughness and the total indicated reading in the same manner, it was indicated that the surface roughness value is 0.13 nm RMS, which showed that there was little change compared to that of the reflective film 102. The TIR value was also 54 nm, and therefore, was confirmed to be unchanged.

The first etch stop film 106 made of SiN was formed on the capping film 104 to have a thickness 3.5 nm by using a silicon (Si) target doped with boron (B), injecting a gas of Ar:N$_2$=5 sccm:3 sccm, and using a process power of 0.6 kW.

The phase shift film 108 was formed on the first etch stop film 106 to have a thickness of 39 nm by using a Ru target and using an Ar gas of 10 sccm and a process power of 0.4 kW. As a result of measuring the reflectance after the formation of the phase shift film 108, it was indicated that the reflectance is 33.2% at a wavelength of 13.5 nm.

The second etch stop film 110 was formed on the phase shift film 108 to have a thickness of 4 nm by using a Cr target, injecting a gas of Ar:N$_2$:NO=5 sccm:5 sccm:5 sccm, and using a process power of 0.6 kW.

The absorbing film 112 made of TaN was formed on the second etch stop film 110 to have a thickness of 30 nm by using a Ta target, injecting a gas of Ar:N$_2$=9 sccm:1 sccm, and a process power of 0.6 kW. As a result of measuring the reflectance on the absorbing film 112 at 13.5 nm, it was indicated that the reflectance was 1.1%, and it was confirmed that there is no problem in the role of the absorbing film.

The hardmask film 114 was formed on the absorbing film 112 to have a thickness of 4 nm by using a Cr target, injecting a gas of Ar:N$_2$:NO=5 sccm:3 sccm:5 sccm, and using a process power of 0.6 kW.

The resist film 116 for e-beam was spin-coated on the hardmask film 114 to a thickness of 80 nm, and as a result, the blankmask 100 for EUV was manufactured.

Hereinabove, the disclosure has been specifically described through the embodiments of the disclosure, but this is only used for the purpose of illustrating and explaining the disclosure, and is not used to limit the meaning or the scope of the disclosure described in the claims. Therefore, those having ordinary skill in the technical field of the disclosure can understand that various modifications and equivalent other embodiments are possible from the embodiments. Accordingly, an actual technical scope of the disclosure is to be defined by the spirit of the appended claims.

DESCRIPTION OF REFERENCE SIGNS

| | |
|---|---|
| 101: LTEM substrate | 102: Reflective film |
| 104: Capping film | 106: First etch stop film |
| 108: Phase shift film | 110: Second etch stop film |
| 112: Absorbing film | 114: Hardmask film |

The invention claimed is:

1. A half-toned attenuated shift blankmask for extreme ultraviolet lithography, comprising:
   a reflective film, a capping film, a first etch stop film, a phase shift film, a second etch stop film, and an absorbing film that are sequentially provided on a transparent substrate.

2. The half-toned attenuated shift blankmask for extreme ultraviolet lithography of claim 1, further comprising:
   a hardmask film provided on the absorbing film.

3. The half-toned attenuated shift blankmask for extreme ultraviolet lithography of claim 1, wherein the first etch stop film is made of silicon (Si) alone or a compound in which at least one of oxygen (O), nitrogen (N), carbon (C), hydrogen (H), boron (B), and metal is contained in the silicon (Si).

4. The half-toned attenuated shift blankmask for extreme ultraviolet lithography of claim 1, wherein the first etch stop film has a thickness of 1 nm to 5 nm.

5. The half-toned attenuated shift blankmask for extreme ultraviolet lithography of claim 1, wherein the phase shift film has a reflectance of 20% or more with respect to an extreme ultraviolet exposure wavelength.

6. The half-toned attenuated shift blankmask for extreme ultraviolet lithography of claim 1, wherein the phase shift film is made of ruthenium (Ru) alone, a compound in which at least one of oxygen (O), nitrogen (N), carbon (C), hydrogen (H), and boron (B) is contained in the ruthenium (Ru), or a compound in which at least one of oxygen (O), nitrogen (N), carbon (C), hydrogen (H), and boron (B) is contained in the ruthenium (Ru) and molybdenum (Mo).

7. The half-toned attenuated shift blankmask for extreme ultraviolet lithography of claim 1, wherein the phase shift film has a thickness of 10 nm to 50 nm.

8. The half-toned attenuated shift blankmask for extreme ultraviolet lithography of claim 1, wherein the second etch stop film is made of chromium (Cr), or a chromium (Cr) compound in which at least one of oxygen (O), nitrogen (N), carbon (C), hydrogen (H), and boron (B) is contained in the chromium (Cr).

9. The half-toned attenuated shift blankmask for extreme ultraviolet lithography of claim 1, wherein the second etch stop film has a thickness of 1 nm to 10 nm.

10. The half-toned attenuated shift blankmask for extreme ultraviolet lithography of claim 1, wherein the absorbing film is made of tantalum (Ta) or a tantalum (Ta) compound in which at least one of oxygen (O), nitrogen (N), carbon (C), hydrogen (H), and boron (B) is contained in the tantalum (Ta).

11. The half-toned attenuated shift blankmask for extreme ultraviolet lithography of claim 1, wherein the absorbing film has a thickness of 10 nm to 50 nm.

12. The half-toned attenuated shift blankmask for extreme ultraviolet lithography of claim 2, wherein the hardmask film is made of chromium (Cr) or a chromium (Cr) compound in which at least one selected from oxygen (O), nitrogen (N), carbon (C), hydrogen (H), and boron (B) is contained in the chromium (Cr).

13. A photomask manufactured using the half-toned attenuated shift blankmask for extreme ultraviolet lithography of claim 1.

\* \* \* \* \*